US011237473B2

(12) United States Patent
Jindal et al.

(10) Patent No.: US 11,237,473 B2
(45) Date of Patent: Feb. 1, 2022

(54) PHYSICAL VAPOR DEPOSITION SYSTEM AND PROCESSES

(71) Applicant: Applied Materials, Inc., Santa Clara, CA (US)

(72) Inventors: Vibhu Jindal, San Jose, CA (US); Wen Xiao, Singapore (SG); Sanjay Bhat, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/801,642

(22) Filed: Feb. 26, 2020

(65) Prior Publication Data
US 2020/0277698 A1    Sep. 3, 2020

Related U.S. Application Data

(60) Provisional application No. 62/812,622, filed on Mar. 1, 2019.

(51) Int. Cl.
G03F 1/24        (2012.01)

(52) U.S. Cl.
CPC ...................... G03F 1/24 (2013.01)

(58) Field of Classification Search
CPC ........................................ G03F 1/24
USPC ............................................ 430/5
See application file for complete search history.

(56) References Cited

U.S. PATENT DOCUMENTS

| | | | |
|---|---|---|---|
| 4,410,407 A | 10/1983 | Macaulay | |
| 5,944,967 A | 8/1999 | Kunz et al. | |
| 6,132,566 A | 10/2000 | Hofmann et al. | |
| 6,323,131 B1 | 11/2001 | Obeng et al. | |
| 6,449,086 B1 | 9/2002 | Singh | |
| 6,818,361 B2 | 11/2004 | Yan | |
| 8,587,662 B1 | 11/2013 | Moll | |
| 8,691,476 B2 | 4/2014 | Yu et al. | |
| 8,802,335 B2 | 8/2014 | Oh et al. | |
| 8,932,785 B2 | 1/2015 | Utzny | |
| 9,329,597 B2 | 5/2016 | Stoschek et al. | |
| 9,580,796 B2 | 2/2017 | Ritchie et al. | |
| 9,612,522 B2 | 4/2017 | Hassan et al. | |
| 9,812,303 B2 | 11/2017 | Ritchie et al. | |
| 10,209,411 B2 | 2/2019 | Goehnermeier et al. | |
| 10,481,484 B2 | 11/2019 | Ikebe et al. | |
| 2003/0019739 A1 | 1/2003 | Shibamoto et al. | |
| 2003/0091910 A1 | 5/2003 | Schwarzl et al. | |
| 2003/0147058 A1 | 8/2003 | Murakami et al. | |
| 2003/0203289 A1 | 10/2003 | Yan et al. | |
| 2004/0151988 A1 | 8/2004 | Silverman | |
| 2004/0213971 A1 | 10/2004 | Colburn et al. | |
| 2005/0084773 A1 | 4/2005 | Krauth | |
| 2005/0133365 A1 | 6/2005 | Hong et al. | |
| 2005/0186485 A1 | 8/2005 | Yoshikawa et al. | |
| 2005/0227152 A1 | 10/2005 | Yan et al. | |
| 2006/0029866 A1 | 2/2006 | Schwarzl et al. | |
| 2006/0251973 A1 | 11/2006 | Takaki et al. | |
| 2007/0020903 A1 | 1/2007 | Takehara et al. | |
| 2008/0248409 A1 | 10/2008 | Ishibashi et al. | |
| 2009/0130569 A1 | 5/2009 | Quesnel | |
| 2010/0167181 A1 | 7/2010 | Kim | |
| 2011/0020737 A1 | 1/2011 | Kamo et al. | |
| 2011/0104595 A1 | 5/2011 | Hayashi et al. | |
| 2011/0168545 A1 | 7/2011 | Shibamoto | |
| 2012/0069311 A1 | 3/2012 | Schwarzl et al. | |
| 2012/0088315 A1 | 4/2012 | Merelle et al. | |
| 2012/0129083 A1 | 5/2012 | Yoshimori et al. | |
| 2012/0322000 A1 | 12/2012 | Uno et al. | |
| 2013/0100428 A1 | 4/2013 | Ruoff et al. | |
| 2013/0162726 A1 | 6/2013 | Mizukami et al. | |
| 2013/0217238 A1 | 8/2013 | Boussie et al. | |
| 2013/0323626 A1 | 12/2013 | Chang | |
| 2014/0051015 A1 | 2/2014 | Gallagher | |
| 2014/0192335 A1 | 7/2014 | Hagio et al. | |
| 2014/0212794 A1 | 7/2014 | Maeshige et al. | |
| 2014/0218713 A1 | 8/2014 | Lu et al. | |
| 2014/0254001 A1 | 9/2014 | Sun et al. | |
| 2014/0254018 A1 | 9/2014 | Sun et al. | |
| 2014/0254890 A1 | 9/2014 | Bergman | |
| 2014/0268080 A1 | 9/2014 | Beasley et al. | |
| 2014/0271081 A1 | 9/2014 | Lavistsky et al. | |
| 2014/0272684 A1 | 9/2014 | Hofmann et al. | |
| 2015/0064611 A1 | 3/2015 | Shih | |
| 2015/0205298 A1 | 7/2015 | Stoschek et al. | |
| 2015/0212402 A1 | 7/2015 | Patil | |
| 2015/0262797 A1 | 9/2015 | Ishihara et al. | |
| 2015/0279635 A1 | 10/2015 | Subramani et al. | |
| 2015/0331307 A1 | 11/2015 | Lu et al. | |
| 2016/0011344 A1 | 1/2016 | Beasley et al. | |

(Continued)

FOREIGN PATENT DOCUMENTS

| | | | |
|---|---|---|---|
| JP | S6376325 A | 4/1988 | |
| JP | 2001085332 A | 3/2001 | |

(Continued)

OTHER PUBLICATIONS

English Translation of KR20070036519, 5 pages.
Extended European Search Report in EP15819417.5 dated Nov. 2, 2017, 11 pages.
Final Office Action in U.S. Appl. No. 16/229,659 dated Jul. 1, 2020, 10 pages.
Machine Translation of JP 2007114336, 23 pages.
Machine Translation of JP 2009099931, 18 pages.
PCT International Search Report and Written Opinion PCT/US2018/067108 dated May 27, 2019, 13 pages.
Non-Final Office Action in U.S. Appl. No. 14/620,114 dated Jul. 22, 2016, 10 pages.
Non-Final Office Action in U.S. Appl. No. 15/438,248 dated May 10, 2018, 15 pages.

(Continued)

Primary Examiner — Christopher G Young
(74) Attorney, Agent, or Firm — Servilla Whitney LLC

(57) ABSTRACT

A physical vapor deposition (PVD) chamber and a method of operation thereof are disclosed. Chambers and methods are described that provide a chamber comprising an upper shield with two holes that are positioned to permit alternate sputtering from two targets. A process for improving reflectivity from a multilayer stack is also disclosed.

13 Claims, 7 Drawing Sheets

(56) References Cited

U.S. PATENT DOCUMENTS

| | | |
|---|---|---|
| 2016/0011499 A1 | 1/2016 | Hassan et al. |
| 2016/0011500 A1 | 1/2016 | Hassan et al. |
| 2016/0011502 A1 | 1/2016 | Hofmann et al. |
| 2016/0147138 A1 | 5/2016 | Shih et al. |
| 2016/0161839 A1 | 6/2016 | Lu et al. |
| 2016/0196485 A1 | 7/2016 | Patterson et al. |
| 2016/0357100 A1 | 12/2016 | Ikuta |
| 2017/0053784 A1 | 2/2017 | Subramani et al. |
| 2017/0062210 A1 | 3/2017 | Visser et al. |
| 2017/0092533 A1 | 3/2017 | Chakraborty et al. |
| 2017/0140920 A1 | 3/2017 | Arnepalli et al. |
| 2017/0115555 A1 | 4/2017 | Hofmann et al. |
| 2017/0131627 A1 | 5/2017 | Hassan et al. |
| 2017/0136631 A1 | 5/2017 | Li et al. |
| 2017/0160632 A1 | 6/2017 | Hassan et al. |
| 2017/0178877 A1 | 6/2017 | Wang et al. |
| 2017/0235217 A1 | 8/2017 | Qi et al. |
| 2017/0256402 A1 | 9/2017 | Kaufman-Osborn et al. |
| 2017/0351169 A1 | 12/2017 | Yu et al. |
| 2018/0031964 A1 | 2/2018 | Jindal |
| 2018/0031965 A1 | 2/2018 | Jindal |
| 2018/0291500 A1 | 10/2018 | Wang et al. |
| 2019/0004420 A1 | 1/2019 | Ozawa et al. |
| 2019/0088456 A1 | 3/2019 | Behara et al. |
| 2019/0382879 A1 | 12/2019 | Jindal et al. |
| 2020/0277698 A1 | 9/2020 | Jindal et al. |

FOREIGN PATENT DOCUMENTS

| | | | |
|---|---|---|---|
| JP | 2007114336 | A | 5/2007 |
| JP | 2009099931 | A | 5/2009 |
| JP | 2012503318 | A | 2/2012 |
| JP | 5045144 | B2 | 10/2012 |
| JP | 2013120868 | A | 6/2013 |
| JP | 2018085332 | A1 | 5/2018 |
| KR | 20070036519 | A | 4/2007 |
| KR | 20080001023 | A | 1/2008 |
| KR | 20110050427 | A | 5/2011 |
| KR | 20110120785 | A | 11/2011 |
| KR | 20160002332 | A | 1/2016 |
| KR | 20170021190 | A | 2/2017 |
| WO | 2013152921 | A1 | 10/2013 |
| WO | 2016007613 | A1 | 1/2016 |
| WO | 2018156452 | A1 | 8/2018 |

OTHER PUBLICATIONS

Non-Final Office Action in U.S. Appl. No. 15/652,501 dated Apr. 20, 2020, 7 pages.
PCT International Search Report and Written Opinion in PCT/US2015/039525 dated Sep. 18, 2015, 10 pages.
PCT International Search Report and Written Opinion in PCT/US2015/039533 dated Sep. 21, 2015, 11 pages.
PCT International Search Report and Written Opinion in PCT/US2017/042747 dated Nov. 2, 2017, 14 pages.
PCT International Search Report and Written Opinion in PCT/US2017/042748 dated Nov. 2, 2017, 15 pages.
PCT International Search Report and Written Opinion in PCT/US2019/040682 dated Oct. 23, 2019, 13 pages.
PCT International Search Report and Written Opinion in PCT/US2019/042143 dated Oct. 29, 2019, 11 pages.
PCT International Search Report and Written Opinion in PCT/US2019/058013 dated Feb. 14, 2020, 12 pages.
PCT International Search Report and Written Opinion in PCT/US2019/067751 dated Apr. 23, 2020, 10 pages.
PCT International Search Report and Written Opinion in PCT/US2020/016021 dated May 29, 2020, 11 pages.
PCT International Search Report and Written Opinion in PCT/US2020/016022 dated Jun. 5, 2020, 11 pages.
PCT International Search Report and Written Opinion in PCT/US2020/016023, dated Jun. 29, 2020, 11 pages.
PCT International Search Report and Written Opinion in PCT/US2020/020029 dated Jun. 30, 2020, 10 pages.
PCT International Search Report and Written Opinion in PCT/US2020/020031 dated Jun. 30, 2020, 12 pages.
PCT International Search Report and Written Opinion in PCT/US2020/020033 dated Jun. 26, 2020, 11 pages.
PCT International Search Report and Written Opinion in PCT/US2020/020034 dated Jun. 23, 2020, 9 pages.
Braun, Stefan, et al., "Multi-component EUV multilayer mirrors", Proc. of SPIE, vol. 5037 (2003), pp. 274-285.
Herregods, Sebastiaan J.F., et al., "Vapour phase self-assembled monolayers for ALD blocking on 300 mm wafer scale, 3 pages".
Jadhav, Sushilkumar A., "Self-assembled monolayers (SAMs) of carboxylic acids: an overview", Central European Journal of Chemistry, pp. 369-378.
Snow, A. W., et al., "Packing density of HS(CH2)nCOOH self-assembled monolayers", Analyst, 2011, 136, 4935, 4935-4949.
Zon, Jerzy, et al., "Synthesis of Phosphonic Acids and Their Esters as Possible Substrates for Reticular Chemistry", 2012, RCS publishing, Chapter 6, total pp. 36. (Year: 2012).
Van Setten, Eelco, et al., "Multilayer optimization for high-NA EUV mask3D suppression", Proc. of SPIE, vol. 11517, Extreme Ultraviolet Lithography 2020, 12 pages.
Wood, Obert, et al., "Improved Ru/Si multilayer reflective coatings for advanced extreme ultraviolet lithography photomasks", BACUS News, Jun. 2016, vol. 32, Issue 6, 11 pages.
Non-Final Office Action in U.S. Appl. No. 16/801,621 dated Jun. 9, 2021, 24 pages.
Non-Final Office Action in U.S. Appl. No. 16/801,631 dated Jun. 9, 2021, 23 pages.

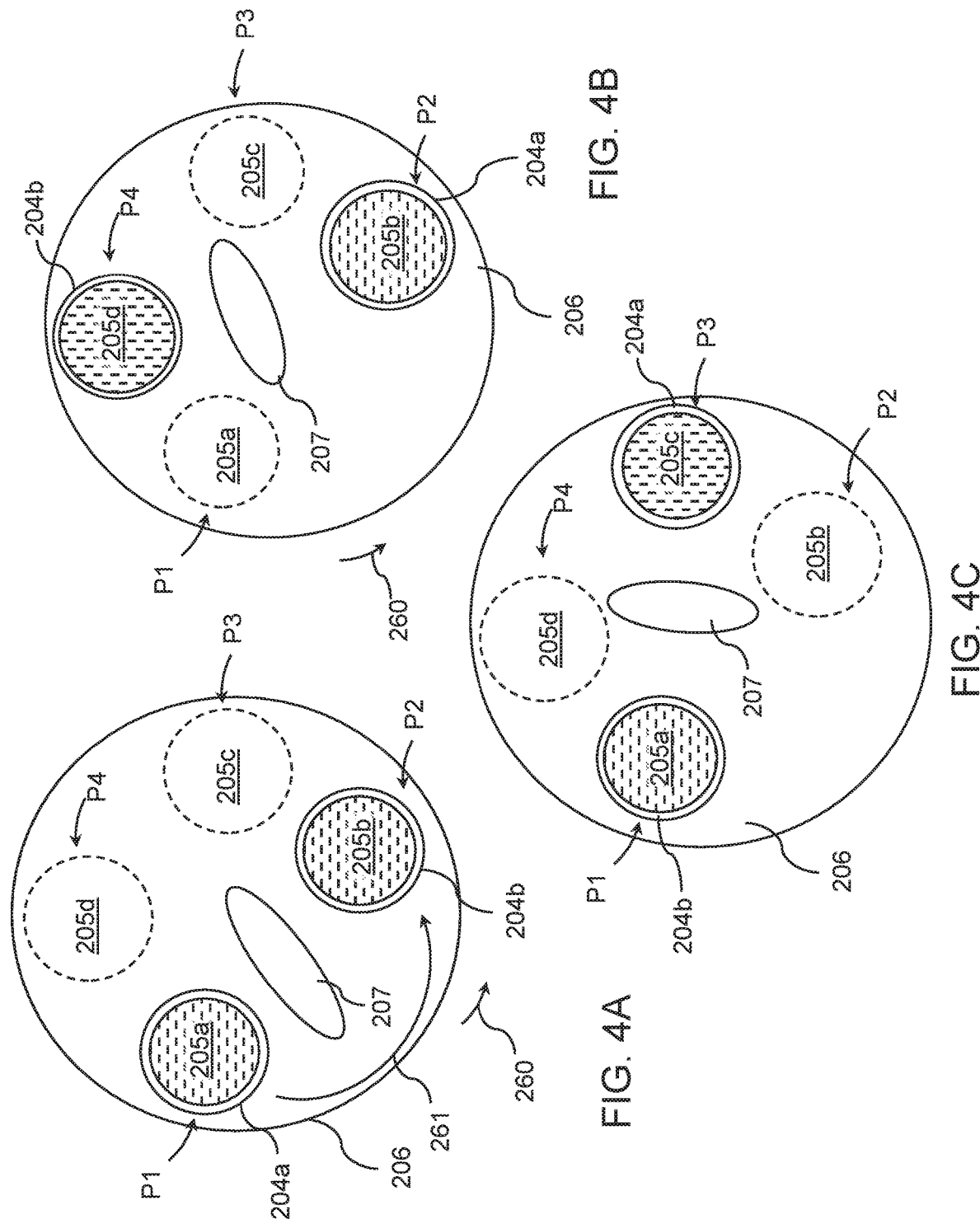

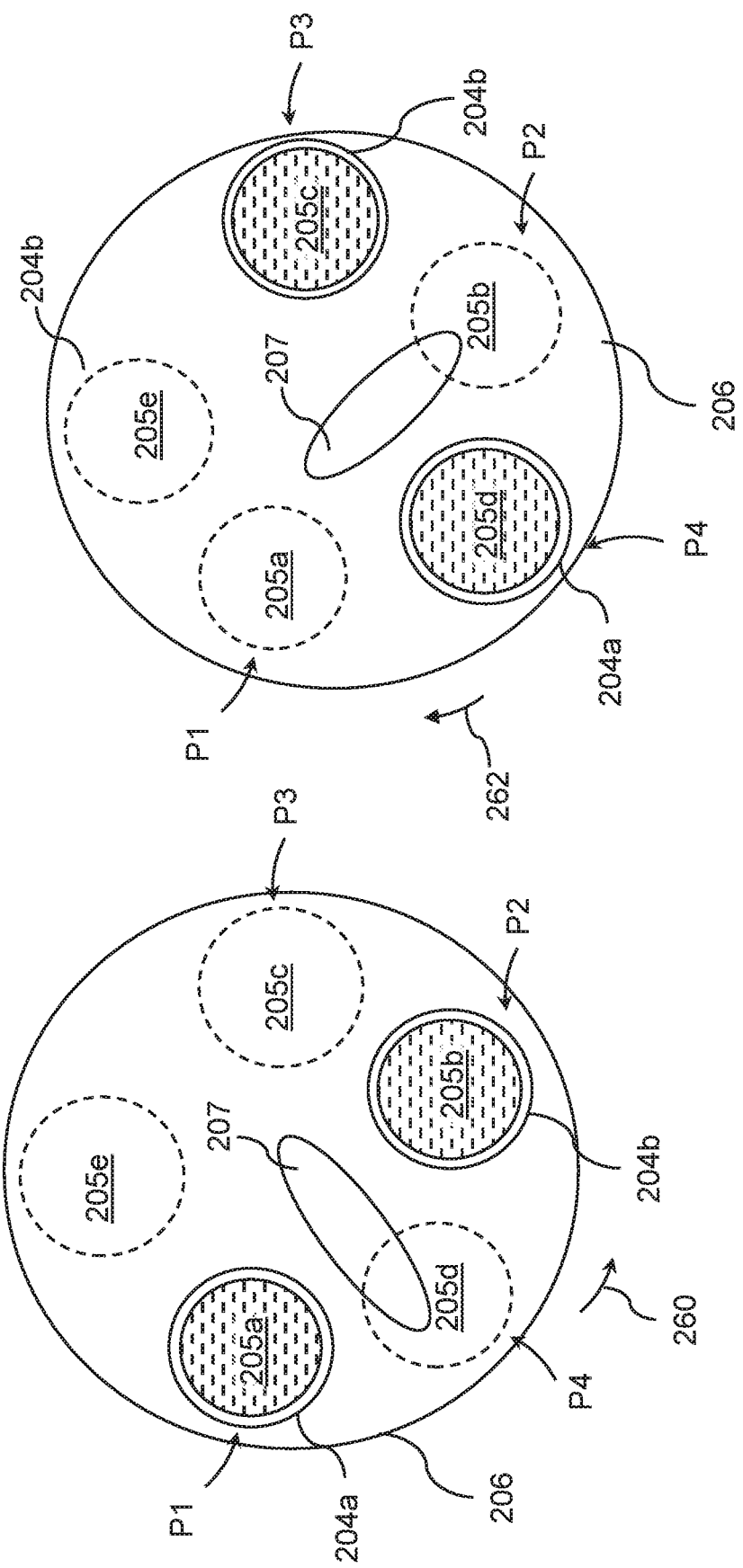

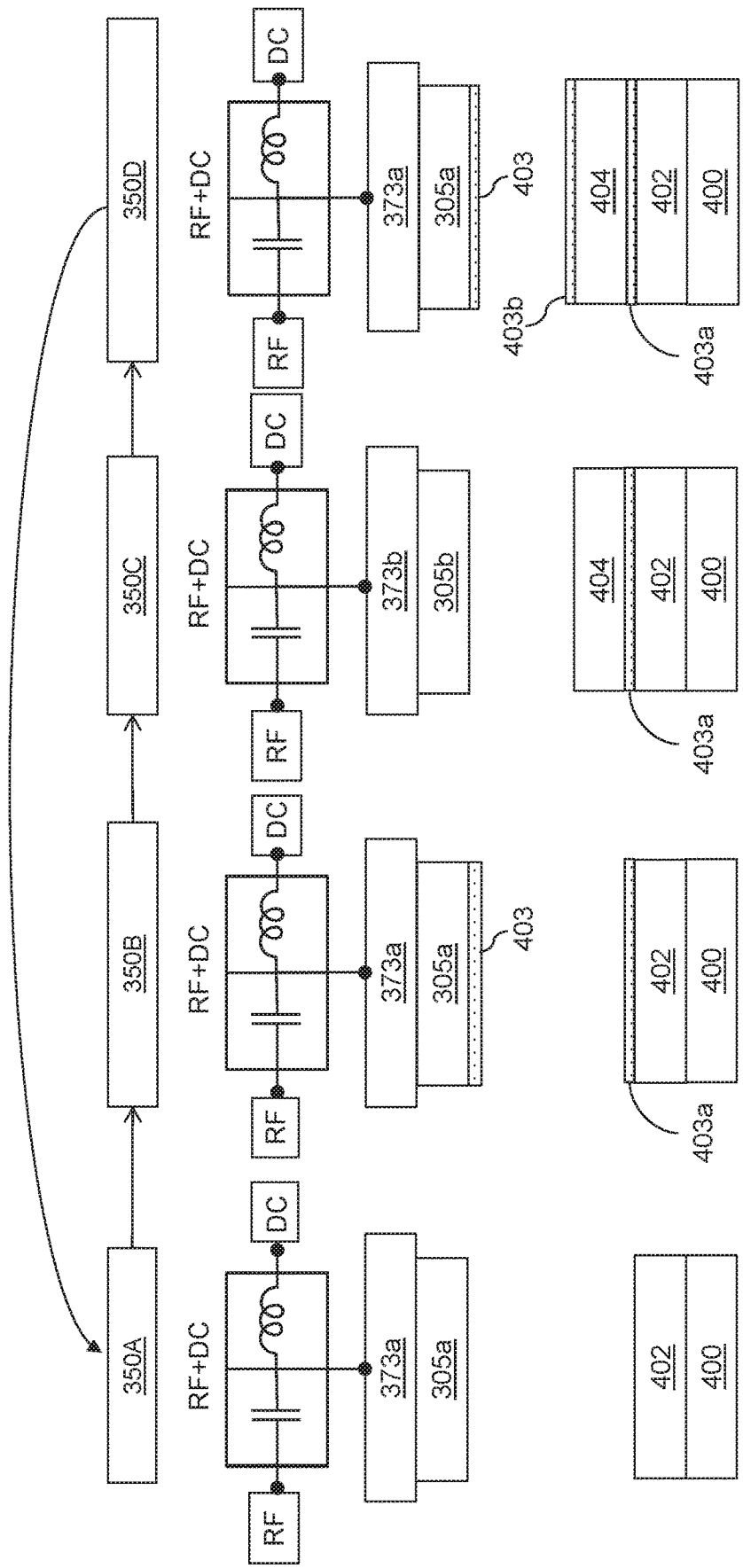

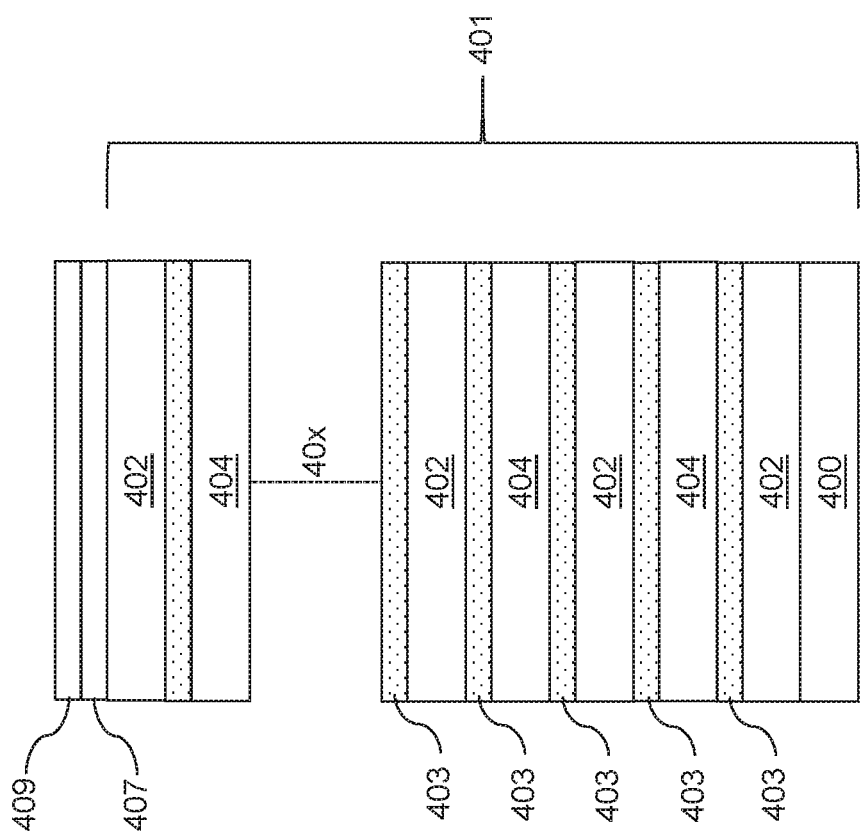

PHYSICAL VAPOR DEPOSITION SYSTEM AND PROCESSES

CROSS-REFERENCE TO RELATED APPLICATIONS

This application claims priority to U.S. Provisional Application No. 62/812,622, filed Mar. 1, 2019, the entire disclosure of which is hereby incorporated by reference herein.

TECHNICAL FIELD

The present disclosure relates generally to substrate processing systems, and more specifically, embodiments pertain to physical vapor deposition systems and processes for physical vapor deposition.

BACKGROUND

Sputtering, alternatively called physical vapor deposition (PVD), is used for the deposition of metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks, minimizing particle generation is desired, because particles negatively affect the properties of the final product. Furthermore, in the manufacture of an EUV mask blank, a multilayer reflector comprising alternating layers of different materials, for example, silicon and molybdenum, is deposited in a PVD chamber. Contamination of the individual silicon and molybdenum layers caused by cross-contamination of the silicon and molybdenum targets can be a problem, which leads to EUV mask blank defects.

Plasma sputtering may be accomplished using either DC sputtering or RF sputtering. Plasma sputtering typically includes a magnetron positioned at the back of the sputtering target including at least two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. Argon is admitted to the chamber. In the sputtering processes, the sputtering target is bombarded by energetic ions, such as a plasma, causing material to be displaced from the target and deposited as a film on a substrate placed in the chamber. The manufacture of EUV mask blanks includes the deposition by PVD of a multilayer stack of alternating layers of two materials, such as silicon and molybdenum on a low expansion substrate. The multilayer stack is reflective of EUV light, which is generally in the 5 to 100 nanometer wavelength range.

There remains a need to reduce defect sources such as particles and cross-contamination of targets of different material in a multi-cathode PVD chamber. In addition, there is a need to improve reflectivity of the multilayer stack at EUV wavelengths such as at 13.5 nm.

SUMMARY

In a first aspect of the disclosure, method of manufacturing an extreme ultraviolet (EUV) mask blank comprises forming a reflective layer pair comprising silicon and molybdenum, wherein forming the reflective layer pair comprises: (a) sputtering a silicon target in a physical vapor deposition (PVD) chamber using a DC power source and an flowing inert gas in the PVD chamber to form a silicon layer on a substrate; (b) sputtering the silicon target using an RF power source and flowing nitrogen gas in the PVD chamber to form a first $Si_3N_4$ interface layer on the silicon layer and a $Si_3N_4$ layer on the silicon target; (c) sputtering a molybdenum target using a DC power source and flowing an inert gas in the PVD chamber to form a molybdenum layer on the $Si_3N_4$ layer; (d) sputtering the silicon target including the $Si_3N_4$ layer thereon using a DC power source and flowing an inert gas in the PVD chamber to form a second $Si_3N_4$ interface layer on the molybdenum layer until the $Si_3N_4$ layer is depleted from silicon target and then depositing a silicon layer on the second $Si_3N_4$ interface layer; and repeating steps (b) through (d) to form a multilayer stack comprising a plurality of reflective layer pairs.

According to a second embodiment of the disclosure, a method comprises method of manufacturing an EUV mask blank comprising forming a reflective layer pair comprising silicon and molybdenum, wherein forming the reflective layer pair comprises (a) sputtering a silicon target in a physical vapor deposition (PVD) chamber using a DC power source and an flowing inert gas in the PVD chamber to form a silicon layer on a substrate; (b) sputtering the silicon target using an RF power source and flowing nitrogen gas in the PVD chamber to form a first $Si_3N_4$ interface layer on the silicon layer and a $Si_3N_4$ layer on the silicon target; (c) sputtering a molybdenum target using a DC power source and flowing an inert gas in the PVD chamber to form a molybdenum layer on the $Si_3N_4$ layer; (d) sputtering the silicon target including the $Si_3N_4$ layer thereon using a DC power source and flowing an inert gas in the PVD chamber to form a second $Si_3N_4$ interface layer on the molybdenum layer until the $Si_3N_4$ layer is depleted from silicon target and then depositing a silicon layer on the second $Si_3N_4$ interface layer; repeating steps (b) through (d) to form a multilayer stack comprising a plurality of reflective layer pairs comprising 40 reflective layer pairs; forming a capping layer on the multilayer stack; and forming an absorber layer on the capping layer.

A third embodiment of the disclosure pertains to an extreme ultraviolet (EUV) mask blank comprising a substrate; a multilayer stack which reflects EUV radiation, the multilayer stack comprising a plurality of reflective layer pair including a silicon layer and a molybdenum layer, and an interface layer between the silicon layer and the molybdenum layer, the interface layer comprising $Si_3N_4$; a capping layer on the multilayer stack of reflecting layers; and an absorber layer on the capping layer.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4A is bottom view of the upper shield and targets in a first rotational position;

FIG. 4B is a bottom view of the upper shield and the targets in a second rotational position;

FIG. 4C is a bottom view of the upper shield and the targets in a third rotational position;

FIG. 5A is a bottom view of the upper shield and targets for in a first rotational position for a deposition process;

FIG. 5B is a bottom view of the upper shield and targets in a second rotational position for a pasting process; and FIG. 6A is a schematic of a portion of a process showing deposition of a silicon layer on a substrate;

FIG. 6B is a schematic of a portion of a process showing deposition of a first silicon nitride interface layer on the silicon layer deposited as shown in FIG. 6A;

FIG. 6C is a schematic of a portion of a process showing deposition of a molybdenum layer on the first silicon nitride interface layer deposited as shown in FIG. 6B;

FIG. 6D is deposition of a second silicon nitride interface layer on the molybdenum layer deposited as shown in FIG. 6A followed by deposition of a silicon layer; and FIG. 7 is a schematic view of a multilayer structure according to an embodiment of the disclosure.

DETAILED DESCRIPTION

Figure 1:
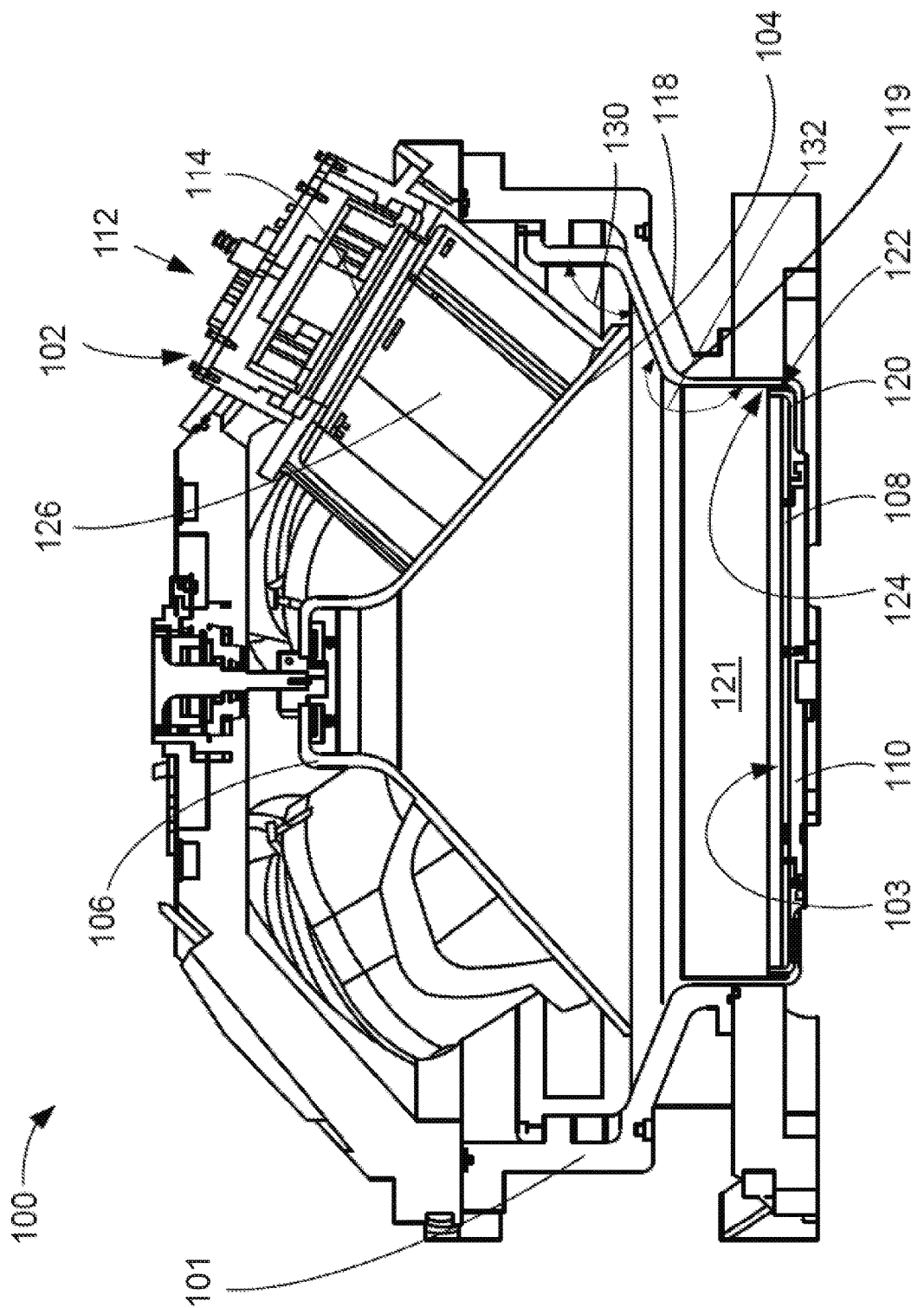
FIG. 1 is a side view of a prior art deposition system.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

Embodiments of the disclosure pertain to a magnet design for a deposition system, for example a physical vapor deposition ("PVD") chamber comprising at least one cathode assembly, and in particular embodiments, a PVD chamber comprising multiple cathode assemblies (referred to herein as a "multi-cathode chamber).

FIG. 1 shows a prior art PVD system, in which a side view of a portion of a deposition system in the form of a PVD chamber 100 is shown. The deposition system in the form of a PVD chamber is shown as a multi-cathode PVD chamber 100 including a plurality of cathode assemblies 102. The multi-cathode PVD chamber 100 is shown as including a multi-target PVD source configured to manufacture an MRAM (magnetoresistive random access memory) or a multi-target PVD source configured to manufacture an extreme ultraviolet (EUV) mask blank, for example a target comprising silicon and a target comprising molybdenum to form a multilayer stack reflective of EUV light.

The multi-cathode PVD chamber comprises a chamber body 101, comprising an adapter (not shown) configured to hold a plurality of cathode assemblies 102 in place in a spaced apart relationship. The multi-cathode PVD chamber 100 can include a plurality of cathode assemblies 102 for PVD and sputtering. Each of the cathode assemblies 102 is connected to a power supply 112, including direct current (DC) and/or radio frequency (RF).

The cross-sectional view depicts an example of a PVD chamber 100 including the chamber body 101 defining an inner volume 121, where a substrate or carrier is processed. The cathode assemblies 102 in the embodiment shown in FIG. 1 can be used for sputtering different materials as a material layer 103. The cathode assemblies 102 exposed through shield holes 104 of an upper shield 106, which is disposed over the substrate or carrier 108 on a rotating pedestal 110. The upper shield 106 is generally conical in shape. There may generally be only one carrier 108 over or on the rotating pedestal 110.

The substrate or carrier 108 is shown as a structure having a semiconductor material used for fabrication of integrated circuits. For example, the substrate or carrier 108 comprises a semiconductor structure including a wafer. Alternatively, the substrate or carrier 108 can be another material, such as an ultra low expansion glass substrate used to form an EUV mask blank. The substrate or carrier 108 can be any suitable shape such as round, square, rectangular or any other polygonal shape.

The upper shield 106 is formed with the shield holes 104 so that the cathode assemblies 102 can be used to deposit the material layers 103 through the shield holes 104. A power supply 112 is applied to the cathode assemblies 102. The power supply 112 can include a direct current (DC) or radio frequency (RF) power supply.

The upper shield 106 is configured to expose one of the cathode assemblies 102 at a time and protect other cathode assemblies 102 from cross-contamination. The cross-contamination is a physical movement or transfer of a deposition material from one of the cathode assemblies 102 to another of the cathode assemblies 102. The cathode assemblies 102 are positioned over targets 114. A design of a chamber can be compact. The targets 114 can be any suitable size. For example, each of the targets 114 can be a diameter in a range of from about 4 inches to about 20 inches, or from about 4 inches to about 15 inches, or from about 4 inches to about 10 inches, or from about 4 inches to about 8 inches or from about 4 inches to about 6 inches.

In FIG. 1, the substrate or carrier 108 is shown as being on the rotating pedestal 110, which can vertically move up and down. Before the substrate or carrier 108 moves out of the chamber, the substrate or carrier 108 can move below a lower shield 118. A telescopic cover ring 120 abuts the lower shield 118. Then, the rotating pedestal 110 can move down, and then the carrier 108 can be raised with a robotic arm before the carrier 108 moves out of the chamber.

When the material layers 103 are sputtered, the materials sputtered from the targets 114 can be retained inside and not outside of the lower shield 118. In this prior art embodiment, telescopic cover ring 120 includes a raised ring portion 122 that curves up and has a predefined thickness. The telescopic cover ring 120 can also include a predefined gap 124 and a predefined length with respect to the lower shield 118. Thus, the materials that form material layers 103 will not be below the rotating pedestal 110 thereby eliminating contaminants from spreading to the substrate or carrier 108.

FIG. 1 depicts individual shrouds 126. The shrouds 126 can be designed such that a majority of the materials from the targets 114 that does not deposit on the carrier 108 is contained in the shrouds 126, hence making it easy to reclaim and conserve the materials. This also enables one of the shrouds 126 for each of the targets 114 to be optimized for that target to enable better adhesion and reduced defects.

The shrouds 126 can be designed to minimize cross-talk or cross-target contamination between the cathode assemblies 102 and to maximize the materials captured for each of the cathode assemblies 102. Therefore, the materials from each of the cathode assemblies 102 would just be individually captured by one of the shrouds 126 over which the cathode assemblies 102 are positioned. The captured materials may not be deposited on the substrate or carrier 108. For example, a first cathode assembly and a second cathode assembly can apply alternating layers of different materials in the formation of an extreme ultraviolet mask blank, for example, alternating layers of silicon deposited from a first target and cathode assembly 102 and a molybdenum from a second target and cathode assembly 102.

The substrate or carrier 108 can be coated with uniform material layer 103 deposited on a surface of the substrate or carrier 108 using the deposition materials including a metal from the targets 114 over the shrouds 126. Then, the shrouds 126 can be taken through a recovery process. The recovery process not only cleans the shrouds 126 but also recovers a residual amount of the deposition materials remained on or in the shrouds 126. For example, there may be molybdenum on one of the shrouds 126 and then silicon on another of the shrouds 126. Since molybdenum is more expensive than silicon, the shrouds 126 with molybdenum can be sent out for the recovery process.

As shown in FIG. 1, the lower shield 118 is provided with a first bend resulting from small angle 130 and a second bend resulting from large angle 132, which result in a knee 119 in the lower shield 118. This knee 119 provides an area in which particles can accumulate during deposition, and is thus a possible source for processing defects.

PVD chambers and processes are utilized to manufacture extreme ultraviolet (EUV) mask blanks. An EUV mask blank is an optically flat structure used for forming a reflective mask having a mask pattern. The reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. The substrate is made from a material having a low coefficient of thermal expansion (CTE) to provide stability during temperature changes, for example, a material such as silicon, glass, oxides, ceramics, glass ceramics, or a combination thereof.

Extreme ultraviolet (EUV) lithography, also known as soft x-ray projection lithography, can be used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or a mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer stack of coatings of alternating reflective layers of materials such as molybdenum and silicon. Reflection values of approximately 65% per lens element or mask blank have been obtained by using substrates that are coated with multilayer coatings that strongly reflect extreme ultraviolet light within an extremely narrow ultraviolet bandpass, for example, 12.5 to 14.5 nanometer bandpass for 13.5 nanometer ultraviolet light. During the manufacture of EUV mask blanks and lens elements, minimization of defects such as defects from particle sources and high reflectivity of the reflective multilayer stack are generally desired.

Figure 2:
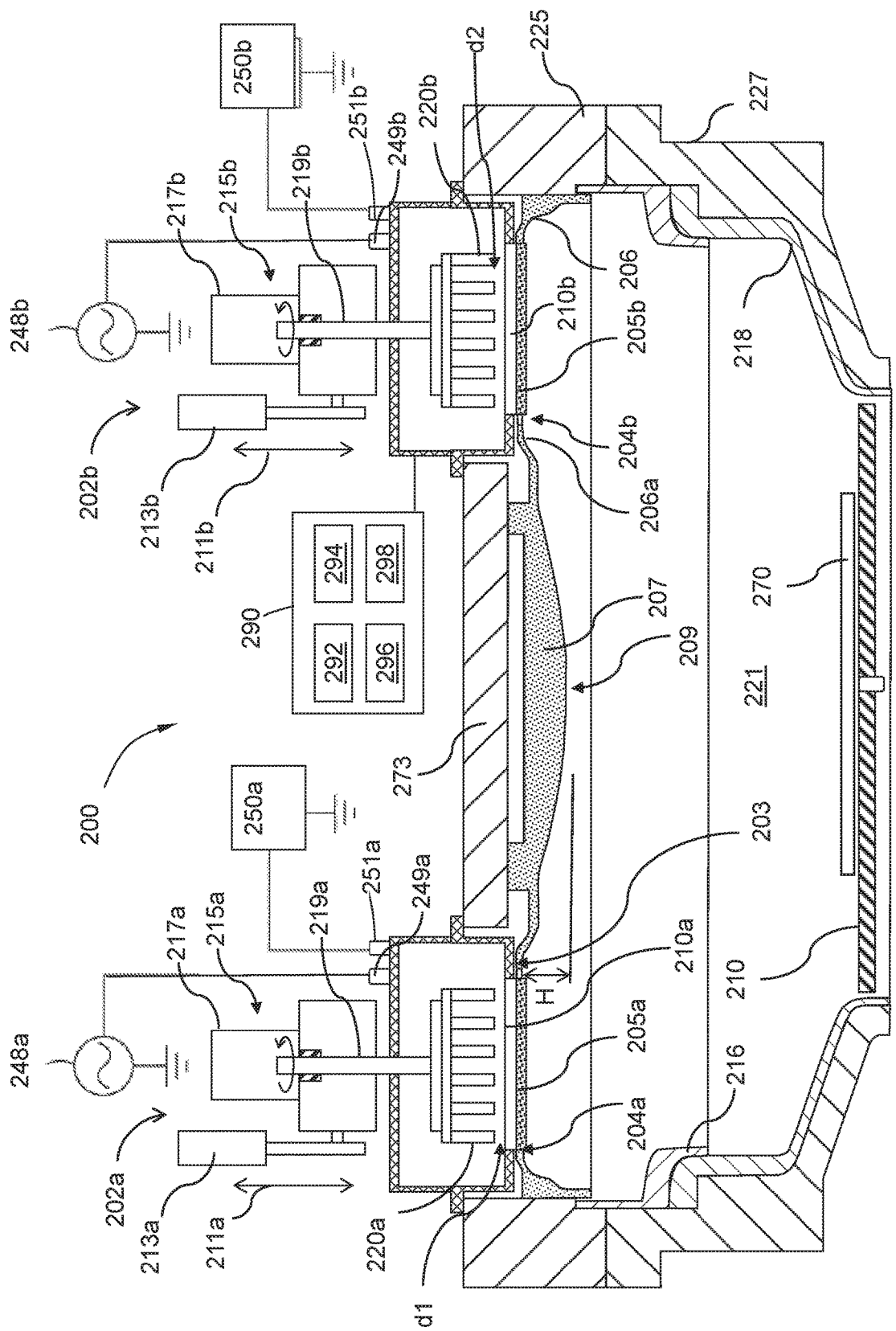
FIG. 2 is a side view of a PVD chamber according to one or more embodiments.

FIG. 2 depicts a PVD chamber 200 in accordance with a first embodiment of the disclosure. PVD chamber 200 includes a plurality of cathode assemblies 202a and 202b. While only two cathode assemblies 202a and 202b are shown in the side view of FIG. 2, a multicathode chamber can comprise more than two cathode assemblies, for example, five, six or more than six cathode assemblies. An upper shield 206 is provided below the plurality of cathode assemblies 202a and 202b, the upper shield 206 having two shield holes 204a and 204b to expose targets 205a, 205b disposed at the bottom of the cathode assemblies 202a to the interior space 221 of the PVD chamber 200. A middle shield 216 is provided below and adjacent upper shield 206, and a lower shield 218 is provided below and adjacent upper shield 206.

A modular chamber body is disclosed in FIG. 2, in which an intermediate chamber body 225 is located above and adjacent a lower chamber body 227. The intermediate chamber body 225 is secured to the lower chamber body 227 to form the modular chamber body, which surrounds lower shield 218 and the middle shield. A top adapter lid 273 (shown in FIG. 8) is disposed above intermediate chamber body 225 to surround upper shield 206.

PVD chamber 200 is also provided with a rotating pedestal 210 similar to rotating pedestal 110 in FIG. 1. A person of ordinary skill will readily appreciate that other components of a PVD chamber, such as those referenced above in FIG. 1 but omitted in FIG. 2 for the sake of clarity, are provided in PVD chamber 200 according to one or more embodiments. It will be appreciated that the upper shield 206 of the PVD chamber 200 of FIG. 2 is substantially flat, compared to the conical upper shield 106 of FIG. 1.

Thus, a first aspect of the disclosure pertains to a PVD chamber 200, which comprises a plurality of cathode assemblies including a first cathode assembly 202a including a first backing plate 210a configured to support a first target 205a during a sputtering process and a second cathode assembly 202b including a second backing plate 210b configured to support a second target 205b during a sputtering process. The PVD chamber further comprises an upper shield 206 below the plurality of cathode assemblies 202a, 202b having a first shield hole 204a having a diameter D1 and positioned on the upper shield to expose the first cathode assembly 202a and a second shield hole 204b having a diameter D2 and positioned on the upper shield 206 to expose the second cathode assembly 202b, the upper shield 206 having a substantially flat inside surface 203, except for a region 207 between the first shield hole 204a and the second shield hole 204b.

The upper shield 206 includes a raised area 209 in the region 207 between the first shield hole and the second shield hole, the raised area 209 having a height "H" from the substantially flat inside surface 203 that greater than one centimeter from the flat inside surface 203 (best seen in FIG. 1) and having a length "L" greater than the diameter D1 of the first shield hole 204a and the diameter D2 of the second shield hole 204b, wherein the PVD chamber is configured to alternately sputter material from the first target 205a and the second target 205b without rotating the upper shield 206.

In one or more embodiments, the raised area 209 has a height H so that during a sputtering process, the raised area height H is sufficient to prevents material sputtered from the first target 205a from being deposited on the second target 205b and to prevent material sputtered from the second target 205b from being deposited on the first target 205a.

According to one or more embodiments of the disclosure, the first cathode assembly 202a comprises a first magnet spaced apart from the first backing plate 210a at a first distance d1 and the second cathode assembly 202b comprises a second magnet 220b spaced apart from the second backing plate 210b at a second distance d2, wherein the first magnet 220a and the second magnet 220b are movable such that the first distance d1 can be varied (as indicated by arrow 211a) and the second distance d2 can be varied (as indicated by arrow 211b. The distance d1 and the distance d2 can be varied by linear actuator 213a to change the distance d1 and linear actuator 213b to change the distance d2. The linear actuator 213a and the linear actuator 213b can comprise any suitable device that can respectively effect linear motion of first magnet assembly 215a and second magnet assembly 215b. First magnet assembly 215a includes rotational motor 217a, which can comprise a servo motor to rotate the first magnet 220a via shaft 219a coupled to rotational motor 217a. Second magnet assembly 215b includes rotational motor 217b, which can comprise a servo motor to rotate the second magnet 220b via shaft 219b coupled to rotational motor 217b. It will be appreciated that the first magnet assembly 215a may include a plurality of magnets in addition to the first magnet 220a. Similarly, the second magnet assembly 215b may include a plurality of magnets in addition to the second magnet 220b.

In one or more embodiments, wherein the first magnet 220a and second magnet 220b are configured to be moved to decrease the first distance d1 and the second distance d2 to increase magnetic field strength produced by the first magnet 220a and the second magnet 220b and to increase the first distance d1 and the second distance d2 to decrease magnetic field strength produced by the first magnet 220a and the second magnet 220b.

In some embodiments, the first target 205a comprises a molybdenum target and the second target 205b comprises a silicon target, and the PVD chamber 200 further comprises a third cathode assembly (not shown) including a third backing plate to support a third target 205c (see FIGS. 4A-C) and a fourth cathode assembly (not shown) including a fourth backing plate configured to support a fourth target 205d (see FIGS. 4A-C). The third cathode assembly and fourth cathode assembly according to one or more embodiments are configured in the same manner as the first and second cathode assemblies 202a, 202b as described herein. In some embodiments, the third target 205c comprises a dummy target and the fourth target 205d comprises a dummy target. As used herein, "dummy target" refers to a target that is not intended to be sputtered in the PVD apparatus 200.

Referring now to FIGS. 4A-C, the first target 205a, the second target 205b, the third target 205c and the fourth target 205d are positioned with respect to each other and the first shield hole 204a and second shield hold 204b so that. In the embodiment shown, first target (positioned under first cathode assembly 202a) is at position P1, the second target 205b (positioned under second cathode assembly 202b) is at position P2. In some embodiments, the raised area 209 is positioned between first shield hold 204a and second shield hole 204b. In the embodiment shown, the first shield hole 204a and the second shield hole 204 b are positioned with respect to the first target 205a, the second target 205b, the third target 205c and the fourth target 205d to facilitate cleaning of the first target 205a and the second target 205b.

In use, the PVD chamber according to one or more embodiments operates as follows during a deposition process. The first shield hole 204a is positioned to expose the first target, and the second shield hole 204b is positioned to expose the second target 205b. The first target 205a and the second target 205b are comprised of different materials. In a specific embodiment of the disclosure, the first target 205a comprises molybdenum and the second target 205b comprises silicon. During a deposition process, material is alternately sputtered from the first target 205a and the second target 205b to form a multilayer stack of alternating materials layers where adjacent layers comprise different materials. Deposition of the alternating layers of materials from the first target 205a and the second target 205b occurs without rotating the upper shield 206, which reduces generation of particulate compared to an apparatus with a single shield hole in which the upper shield must be rotated to accomplish alternate deposition of different materials to form a multilayer stack comprised of two different materials. In one or more embodiments, the alternating layers comprise silicon and molybdenum to form a multilayer stack that is reflective of EUV light. FIG. 4A depicts the position of the first target 205a in position P1 and target 205b at position P2. In some embodiments, the upper shield comprises a raised area 209 in the region 207 between the first shield hold 204a and the second shield hole 204b.

In the embodiment shown, the upper shield 206 is circular, and the center of the first shield hole 204a at the first position P1, and the second position P2 where the center of the second shield hole 204b is located is 150 degrees in a counterclockwise direction indicated by arrow 261 from the center of the first shield hole 204a. Likewise, the center of target 205a and the center of the second target 205b at positions P1 and P2, which are 150 degrees apart from each other. In FIG. 4A third target 205c and fourth target 205d are dummy targets which are covered by the flat inside surface of the upper shield 206 and shown with their outlines as dotted lines.

FIG. 4B shows the position of the first shield hold 204a as positioned over second target 205b and the second shield hold 204b as positioned over fourth target 205d, which is a dummy target. The shield holes 204a and 204b have been rotated counterclockwise 150 degrees from the deposition position of FIG. 4A. The position of the first shield hole at position P4 is over the fourth target 205d, the center of which is located 300 degrees counterclockwise from the center of the first target 205a. The second shield hole 204b is now located over the second target 205b, the center of which is located 150 degrees counterclockwise from the center of the first target 205a. It will be understood by a person of ordinary skill in the art that the positions of the individual targets are fixed with respect to their respective cathode assemblies, while the upper shield 206 is rotated over the targets. FIG. 4B is a cleaning position, in which the second target 205b can be cleaned using a plasma. An advantage of cleaning in the manner shows in FIG. 4B where the second shield hole 204b is positioned to expose a dummy target (fourth target 205d) while the first shield hole exposes the second target 205b is that cleaning of the second target can be conducted while the first target 205a is covered (as indicated by the dashed line), and the first target 205a will not be contaminated by the cleaning process which removes contaminants from the second target, which is a different material from the first target. In addition, the fourth target 205d, which is a dummy target prevents the material which has been cleaned from the second target 205b from travelling through an open shield hole (the second shield hole 204b) and contaminating the chamber, namely the top adapter lid 273.

FIG. 4C shows the position of the shield holes 204a and 204b after rotation counterclockwise 60 degrees, as indicated by arrow 260 in FIG. 4B. In this position, the second shield hole, which has now been rotated 210 degrees from the deposition position shown in FIG. 4A is now positioned over the first target 205a at position P1, and the first shield hole 204a is now positioned over the third target 205c, which is a dummy target. The second target 205b and the fourth target 205d, both shown as dashed lines, are now covered by the upper shield. In the position shown in FIG. 4C, the first target 205a is exposed through the second shield hole 204b and the third target 205c is exposed by the first shield hole 204a. The first target 205a can be cleaned in a cleaning process with a plasma Summarizing FIGS. 4A-C, by spacing electrode assemblies and the associated targets at the periphery of a multi-cathode chamber in the manner shown and using a rotatable upper shield comprising two shield holes spaced from each other at the periphery of the upper shield as shown, the first target 205a and the second target 205b can be cleaned using a plasma process in a PVD chamber. In one or more embodiments, when the third target 205c and the fourth target 205d are dummy targets that are not intended to be sputtered as part of deposition process, the dummy targets prevent contamination of the chamber during cleaning of the first target 205a and the second target 205b. In some embodiments, the dummy targets comprise a side and front surface (the surface facing the PVD chamber and substrate in the PVD chamber) are textured to ensure no particle generation after large amount of deposition of material which has been cleaned from the first target 205a and the second target 205b. In some embodiments, the textured surface is provided by arc spraying.

In the specific embodiment shown, the upper shield 206 is circular, and two shield holes are spaced at the outer periphery of the upper shield 206 at the shield hole centers so that when the upper shield 206 is rotated with respect to the PVD chamber 200, the shield holes expose two targets (either deposition targets such as first target 205a and the second target 205b). The first shield hole 204a and the second shield hole are spaced apart by their centers by 150 degrees on the outer periphery of the upper shield 206, and indicated by arrow 261 in FIG. 4A.

In the embodiment shown, at least four cathode assemblies and targets below the cathode assemblies are spaced around the outer periphery of the of PVD chamber top adapter lid 273 so that when the upper shield 206 is rotated, two different targets are exposed each time the upper shield is rotated. In FIGS. 4A-C, the center of second target 205b, which is circular, is 150 degrees in a counterclockwise direction from the center of the first target 205a, which is also circular. Additionally, the center of third target 205c, which is circular and a dummy target is 210 degrees in a counterclockwise direction from the center of the first target 205a, and the center of fourth target 205d, which is circular and a dummy target is 300 degrees in a counterclockwise direction from the first target. By arranging the targets in this manner on the top adapter lid 273 and the upper shield 206 having the centers of the shield holes 204a and 204b spaced apart by 250 degrees, but rotating the upper shield 206, the first and second targets 205a, 205b can both be exposed during a deposition process, and then during a cleaning process the second target 205b and a dummy target can be exposed to clean the second target and the first target 205a and another dummy target can be exposed to clean the first target 205a while the other deposition target is not subject to contamination from cleaning of the target.

Stated another way, in one or more embodiments, the third target 205c and the fourth target 205d are positioned with respect to the first target 205a and second target 205b so that when the upper shield 206 is in a first position, the first target 205a is exposed through the first shield hole 204a and the second target 205b is exposed through the second shield hole 204b, and the third target 205c and fourth target 205d are covered by the upper shield 206. When the upper shield 206 is rotated to a second position, the fourth target 205d is exposed through the second shield hole 204b and the second target 205b is exposed through the first shield hole 204a. In some embodiments, when the upper shield 206 is rotated to a third position, the first target 205 is exposed through the second shield hole 204b and the fourth target 205d is exposed through the first shield hole 204a.

In another embodiment, a physical vapor deposition (PVD) chamber 200 comprises a plurality of cathode assemblies including a first cathode assembly 202a including a first backing plate 210a supporting a first target 205a comprising molybdenum and a second cathode assembly 202b including a second backing plate 210b supporting a second target 205b comprising silicon, a third cathode assembly including a third backing plate supporting a third target 205c comprising a dummy material, and a fourth cathode assembly including a fourth backing plate supporting a fourth target 205d comprising a dummy material. In this embodiment, an upper shield 206 is below the plurality of cathode assemblies having a first shield hole 204a having a diameter D and positioned on the upper shield to expose the first target 205a and a second shield hole 204b having a diameter D and positioned on the upper shield to expose the second target 205, the upper shield 206 having a flat inside surface 203 between the first shield hole 204a and the second shield hole 204b and configured to permit molybdenum and silicon material to be alternately sputtered from the first target 205a and the second target 205b respectively without rotating the upper shield 206. In this embodiment, the upper shield 206 includes a raised area 209 between the two of the shield holes having a height H greater than one centimeter and having a length greater than the diameter D of the first shield hole 204a and the second shield hole 204b, wherein the upper shield 206 is rotatable to allow one of the first shield hole 204a and the second shield hole 204b to expose the first target 205a and one of third target 205c and the fourth target 205d.

In some embodiments, each of the first cathode assembly, the second cathode assembly, third cathode assembly and fourth cathode assembly comprise a magnet spaced apart from the first backing plate at a first distance, the second backing plate at a second distance, the third backing plate at a third distance and the fourth backing plate at a fourth distance, each of the magnets being movable to increase or decrease each of the first distance, the second distance, third distance or fourth distance. Decreasing the first distance, the second distance, the third distance or the fourth distance increases magnetic field strength produced by the magnet. Increasing the first distance, the second distance, the third distance or the fourth distance decreases magnetic field strength produced by the magnet.

Plasma sputtering may be accomplished using either DC sputtering or RF sputtering in the PVD chamber 200. In some embodiments, the process chamber includes a feed structure for coupling RF and DC energy to the targets associated with each cathode assembly. For cathode assembly 202a, a first end of the feed structure can be coupled to an RF power source 248a and a DC power source 250a, which can be respectively utilized to provide RF and DC energy to the target 205a. The RF power source 248a is coupled to RF power in 249a and the DC power source 250a is coupled to DC power in 251a. For example, the DC power source 250a may be utilized to apply a negative voltage, or bias, to the target 305a. In some embodiments, RF energy supplied by the RF power source 248a may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

Likewise, for cathode assembly 202b, a first end of the feed structure can be coupled to an RF power source 248b and a DC power source 250b, which can be respectively utilized to provide RF and DC energy to the target 205b. The RF power source 248b is coupled to RF power in 249a and the DC power source 250b is coupled to DC power in 251b. For example, the DC power source 250b may be utilized to apply a negative voltage, or bias, to the target 205b. In some embodiments, RF energy supplied by the RF power source 248b may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

While the embodiment shown includes separate RF power sources 248a and 248b for cathode assemblies 202a and 202b, and separate DC power sources 250a and 250b for cathode assemblies 202a and 202b, the PVD chamber can comprise a single RF power source and a single DC power source with feeds to each of the cathode assemblies.

Another aspect of the disclosure pertains to a method of depositing alternating material layers in a physical vapor deposition (PVD) chamber. In one embodiment, the method comprises placing a substrate 270 in the PVD chamber 200 comprising a plurality of cathode assemblies including a first cathode assembly 202a including a first target 205a comprising a first material and a second cathode assembly 202b including a second target 205b comprising a second material different from the first material. The method further comprises disposing an upper shield 206 below the plurality of cathode assemblies, the upper shield having a first shield hole 204a having a diameter D1 and positioned on the upper shield 206 to expose the first target 205a and a second shield hole 204b having a diameter D2 and positioned on the upper shield 206 to expose the second target 205b, the upper shield 206 further comprising a flat inside surface 203 between the first shield hole 204a and the second shield hole 204b and a raised area 209 in a region 207 between the two of the shield holes 204a, 204b having a length L at least equal to the diameter D1 of the first shield hole and the second shield hole D2. In some embodiments, the raised area 209 has a height H greater than one centimeter. The method further comprises alternately sputtering material from the first target 204a and the second target 204b without rotating the upper shield 206, wherein the raised area prevents the first material from contaminating the second target and prevents the second material from contaminating the first target.

In some embodiments of the method, the PVD chamber further comprises a third target 205c comprising dummy material and a fourth target 205d comprising dummy material and wherein third target 205c and the fourth target 205d are positioned with respect to the first target 205a and second target 205b so that when the upper shield 206 is in a first position, the first target 205a is exposed through the first shield hole 204a and the second target 205b is exposed through the second shield hole 204b, and the third target 205c and fourth target 205d are covered by the upper shield 206 during depositing alternating material layers from the first target 205a and the second target 205b.

In some embodiments of the method, the method further comprises cleaning first material deposited on the second target 205b by applying a magnetic field to the second target that is greater than a magnetic field applied during depositing alternating material layers. In some embodiments, the method further comprises comprising cleaning second material deposited on the first target 205a by applying a magnetic field to the first target that 205a is greater than a magnetic field applied during depositing alternating material layers.

In some embodiments, the method further comprises rotating the upper shield 206 from the first position to a second position prior to cleaning the first material from the second target 205b, the fourth target 205d is exposed through the second shield hole 204b and the second target 205b is exposed through the first shield hole 204a. In one or more embodiments, the method comprises rotating the upper shield 206 from the second position to a third position so that the first target 205a is exposed through the second shield hole 204b and the fourth target 205d is exposed through the first shield hole 204a. In specific embodiments of the method, the substrate 270 comprises an extreme ultraviolet (EUV) mask blank. In specific embodiments of the method the first target material comprises molybdenum and the second target material comprises silicon. In some embodiments, the method further comprises depositing multiple alternating materials layers comprising a first layer comprising molybdenum and a second layer comprising silicon.

In another aspect of the disclosure, the targets associated with the first cathode assembly, the second cathode assembly, the third cathode assembly and the fourth cathode assembly are comprised of material to permit a co-sputtering and pasting process.

A benefit of the upper shield with the first shield hole 204a and the second shield hole arranged in the upper shield according to embodiments described herein include the ability to deposit alternating layers of different materials without rotating the upper shield. In some embodiments, after completion of a process of depositing a multilayer stack on a substrate, the upper shield can be rotated as described above to conduct a cleaning operation in which one of the shield holes is positioned over a dummy target.

In some embodiments, a target configuration can be used to perform a multilayer stack deposition process on a substrate while the shield is not rotated by alternately sputtering material from the first and second target, and then by rotating the shield, a pasting process can be conducted to paste material on the interior of the PVD chamber. It was determined that when two different materials are deposited from a first and second target, for example, molybdenum from a first target and silicon from a second target, material from the second target (e.g., silicon) may accumulate near the shield hole that was over the second target, cause a second material rich defect source (e.g., Si-rich defect source). The second material rich defect source in some embodiments causes second material defects (e.g. Si defects). It was determined that by pasting the interior of the PVD chamber, namely the upper shield, 206, the middle shield 216, and the lower shield 218 with the first material, e.g., molybdenum, second material defects (e.g., Si defects) could be reduced or prevented. The upper shield comprising a first shield hole and a second shield hole according to embodiments described herein facilitates a way to quickly conduct a pasting operation by rotating the upper shield to a position to conduct a pasting process.

Thus, with reference to FIGS. 2, 3, and 5A-B, one or more embodiments pertain to a physical vapor deposition (PVD) chamber 200 comprising a plurality of cathode assemblies including a first cathode assembly 202a including a first backing plate 210a to support a first target 205a comprising a first material during a sputtering process and a second cathode assembly 202b including a second backing plate 210b configured to support a second target 205b comprising a second material different from the first material during a deposition process. The deposition process is conducted when there is a substrate 270 in the PVD chamber. The PVD chamber 200 further comprises an upper shield 206 below the plurality of cathode assemblies including a first shield hole 204a having a diameter and positioned on the upper shield 206 and with respect to the first and second cathode assemblies 202a, 202b to expose the first target 205a during a deposition process and a second shield hole 204b having a diameter and positioned on the upper shield to expose the second target 205b during a deposition process. The PVD chamber 200 is configured to alternately sputter the first material from the first target 205a and the second material from the second target 205b onto a substrate in the PVD chamber 200 without rotating the upper shield 206.

In some embodiments, a third cathode assembly (not shown) includes a third backing plate and a third target 205c comprising a third material that is the same as the first material and a fourth cathode assembly (not shown) including a backing plate and a fourth target 205d comprising a fourth material that is the same as the third material.

In some embodiments and ash shown in FIG. 5B, the upper shield 206 is rotatable from a first position in which the first target 205a at position P1 and the second target at position P2 are exposed during a deposition process. The PVD chamber is configured so that the upper shield 206 is rotatable to a second position in which the third target at position P3 and the fourth target 205d at position P4 are exposed for a pasting process in which material from the third target 205c and the fourth target 205d is pasted on the interior of the chamber while the first target 205a and the second target are 205b covered by the upper shield. As discussed above, such a configuration of the cathode assemblies and targets 205a, 205b, 205c, 205d allows for pasting of a first material such as molybdenum on the interior surface of the PVD chamber to reduce prevent defects from areas that generated from areas that are rich in the second material (e.g., Si).

In one or more embodiments, the upper shield 206 has flat inside surface 203, except for a region 207 between the first shield hole 204a and the second shield hole 204a and a raised area 209 in the region between the first shield hole 204a and the second shield hole 204a, the raised area 209 having a height H sufficient so that during a deposition process, the raised area 209 prevents material sputtered from the first target 205a from being deposited on the second target 205b and to prevent material sputtered from the second target 205b from being deposited on the first target 205a. In one or more embodiments, the height H of the raised area is at least 1 cm from the flat inside surface 203 of the upper shield 206 a length L greater than the diameter of the first shield hole and the diameter of the second shield hole.

In some embodiments of the PVD chamber having the configuration of targets shown in FIGS. 5A and 5B, The PVD chamber of claim 5, wherein the first cathode assembly 202a comprises a first magnet 220a spaced apart from the first backing plate 210a at a first distance d1 and the second cathode assembly 202b comprises a second magnet 220b spaced apart from the second backing plate 210b at a second distance d2, and the first magnet 220a and the second magnet 220b are movable such that the first distance d1 can be varied and the second distance d2 can be varied. In specific embodiments, the first magnet 220a and second magnet 220b are configured to be moved to decrease the first distance and the second distance to increase magnetic field strength produced by the first magnet 220a and the second magnet 220b and to increase the first distance d1 and the second distance d2 to decrease magnetic field strength produced by the first magnet 220a and the second magnet 220b.

Another embodiment of a PVD chamber having the target configuration shown in FIGS. 5A and 5B comprises a plurality of cathode assemblies including a first cathode assembly 202a including a first backing plate 210a supporting a first target 205a comprising molybdenum and a second cathode 202b assembly including a second backing plate 210b supporting a second target 205b comprising silicon, a third cathode assembly (not shown) including a third backing plate supporting a third target 205c comprising molybdenum, and a fourth cathode assembly (not shown) including a fourth backing plate supporting a fourth target 205d comprising molybdenum. The PVD chamber as configured further comprises an upper shield 206 below the plurality of cathode assemblies having a first shield hole 204a having a diameter and positioned on the upper shield 206 to expose the first target 205a and a second shield 204b hole having a diameter and positioned on the upper shield 206 to expose the second target 205b when the upper shield 206 is in a first position, the upper shield 206 having a flat inside surface 203, except for a region 207 between the first shield hole 204a and the second shield hole 204b, the upper shield 206 positioned with respect to the first target 205a and the second target 205b and the PVD chamber to permit molybdenum and silicon material to be alternately sputtered from the first target and the second target respectively without rotating the upper shield 206. The upper shield of this embodiment includes a raised area 209 in the region 207 between the first shield hole 204a and the second shield hole 204b, the raised area 209 and having a length L greater than the diameter D1 of the first shield hole 204a and the diameter D2 of the second shield hole 204b, wherein the upper shield 206 is rotatable to allow one of the first shield hole 204a and the second shield hole 204b to expose the first target 205a and one of third target 205c and the fourth target 205d. The PVD chamber 200 may further comprise a fifth cathode assembly (not shown) with a backing plate and a fifth target 205e as shown in FIGS. 5A and 5B.

In a variant on this embodiments, the upper shield 206 is configured to be rotated to a second position with respect to the first target 205a, the second target 205b, the third target 205c and the fourth target 205d so that the second shield hole 204b is over the third target 205c to expose the third target 205c and the first shield hole 204a is over the fourth target 205d to expose the fourth target 205d. In another variant on this embodiment, when the upper shield 206 is in the second position, the PVD chamber 200 is configured to perform a pasting operation wherein molybdenum from the third target 205c and the fourth target 205d are pasted on the interior of the chamber and the first target 205a and the second target 205b are covered by the upper shield 206. This configuration is shown in FIG. 5B, with the first target 205a and the second target 205b shown as outlined by dashed lines.

Another aspect of the disclosure comprises method of depositing alternating material layers in a physical vapor deposition (PVD) chamber comprising operating a PVD chamber comprising a plurality of cathode assemblies including a first cathode assembly 202a including a first target 205a comprising a first material, a second cathode assembly 202b including a second target 205b comprising a second material different from the first material, a third cathode assembly including a third target 205c comprising the same material as the first target, and a fourth cathode assembly including a target 205d comprising a material the same as the first target. The method further comprises disposing an upper shield 206 below the plurality of cathode assemblies, the upper shield having a first shield hole 204a having a diameter D1 and positioned on the upper shield 206 to expose the fourth target 205d and a second shield hole having a diameter D2 and positioned on the upper shield to expose the third target 205c. The method includes alternately sputtering material from the third target 205c and the fourth target 205d to deposit the third target material and the fourth target material on an interior of the PVD chamber. This configuration is shown in FIG. 5B.

Depositing material from the third target 205c and the fourth target 205d prevents defects deposited from the first target 205a from contaminating the interior of the PVD chamber. In some embodiments of the method, wherein the upper shield further comprises a flat inside surface 203, except for a region 207 between the first shield hole 204a and the second shield hole 204b. In one embodiment, the region 207 between the first shield hole 204a and the second shield hole 204b includes a raised area 209 having a length L at least equal to the diameter D1 of the first shield hole 204a and the diameter D2 of the second shield hole 204b.

One or more embodiments of the method comprises rotating the upper shield 206 from the position in FIG. 5B to the position in FIG. 5A so that the first shield hole 204a is over the first target 205a to expose the first target 205aa and the second shield hole 204b is over the second target 205b to expose the second target 205b. This can be accomplished by rotating the upper shield 206 clockwise in the direction of arrow 262 by 150 degrees, or alternatively rotating the upper shield counterclockwise 210 degrees so that the first shield hole 204a is over the first target 205a as shown in FIG. 5A.

After rotating to the position shown in FIG. 5A, the method of some embodiments comprises placing a substrate 270 in the chamber 200 and alternately sputtering material from the first target 205a and the second target 205b without rotating the upper shield 206, wherein the raised area 209 prevents the first material from contaminating the second target 205b and prevents the second material from contaminating the first target 205a.

In specific embodiments, the substrate 270 comprises an extreme ultraviolet (EUV) mask blank. In such embodiments, the first target material comprises molybdenum and the second target material comprises silicon. The method according to these embodiment may further comprise depositing multiple alternating materials layers comprising a first layer comprising molybdenum and a second layer comprising silicon.

The configuration and spacing of the targets 205a, 205b, 205c and 205d in FIGS. 5A and 5B, together with the shield holes 204a, 204b spaced as shown facilitates both deposition of alternating different material layers on a substrate in one process, and then, by rotating the upper shield degrees, pasting of molybdenum on the interior of the PVD chamber 200 to prevent generation of defects from the second material (e.g., silicon). As shown, the center of first target 205a is spaced 150 degrees from the center of the second target 205b around periphery of the PVD chamber 200 top adapter lid 273. The center of third target 205c is spaced 150 degrees from the center of the fourth target 205d. Since the first shield hole 204a center and the second shield hole 204b centers are spaced 150 degrees around the periphery of the upper shield 206, when the upper shield is in a first position, the first shield hole is at the location of the first target 205a at position P1 and the second shield hole 204 b is at position P2 over the second target 205b.

Because the center of the fourth target is spaced 90 degrees at the periphery of the top adapter lid 27 from the center of the first target 205a and the third target 205 center is spaced 90 degrees around the periphery of the top adapter lid 273 from the second target 205b, rotation of the upper shield 206 in a clockwise direction will position the first shield hole 204a and the second shield hole for a pasting process as described above.

In some embodiments, the methods described herein are conducted in the PVD chamber 200 equipped with a controller 290. There may be a single controller or multiple controllers. When there is more than one controller, each of the controllers is in communication with each of the other controllers to control of the overall functions of the PVD chamber 200. For example, when multiple controllers are utilized, a primary control processor is coupled to and in communication with each of the other controllers to control the system. The controller is one of any form of general-purpose computer processor, microcontroller, microprocessor, etc., that can be used in an industrial setting for controlling various chambers and sub-processors. As used herein, "in communication" means that the controller can send and receive signals via a hard-wired communication line or wirelessly.

Each controller can comprise processor 292, a memory 294 coupled to the processor, input/output devices coupled to the processor 292, and support circuits 296 and 298 to provide communication between the different electronic components. The memory includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. In one or more embodiments, some or all of the methods of the present disclosure are controlled hardware. As such, in some embodiments, the processes are implemented by software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller has one or more configurations to execute individual processes or sub-processes to perform the method. In some embodiments, the controller is connected to and configured to operate intermediate components to perform the functions of the methods.

The PVD chambers 200 and methods described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer can be formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layer of, for example, molybdenum and silicon are formed by physical vapor deposition, for example, in a multi-cathode source chamber as described herein. In one or more embodiments, the chambers and the methods described herein can be used to deposit a multilayer stack of 20-60 reflective pairs of molybdenum and silicon. The unique structure of the upper shield with two shield holes enables deposition of a multilayer stack with fewer defects. The multicathode arrangement with the targets including the dummy targets and second material target as arranged in the embodiments described herein facilitates cleaning of the molybdenum and silicon targets and pasting of the interior of the chamber.

The PVD chambers 200 described herein are utilized to form the multilayer stack, as well as capping layers and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

Another aspect of the disclosure pertains to a method of manufacturing an EUV mask blank with a reflective layer stack exhibiting improved reflectivity. A first embodiment of this method, with reference to FIGS. 6A-D and FIG. 7 comprises forming a reflective layer pair comprising silicon and molybdenum. FIG. 6A schematically shows the step of forming the silicon layer on the substrate. The substrate is placed in the PVD chamber 100 of FIG. 1 or the PVD chamber 200 of FIG. 2 as described above, or any chamber capable of sputtering silicon and molybdenum. The chamber is supplied with a direct current (DC) power source and a radio frequency (RF) power source, as shown with respect to the chamber in FIG. 2.

As shown in FIG. 6A, the first step in forming the reflective layer pair at 350A comprises sputtering a silicon target 305a mounted to a backing plated 373a in a physical vapor deposition (PVD) chamber using a DC power source and an flowing inert gas in the PVD chamber to form a silicon layer 402 on a substrate 400. A person or ordinary skill in the art will understand that flowing the inert gas, for example, argon, causes the gas to be energized so that atoms from the silicon target are ejected by momentum transfer from a bombarding argon gas ion energized by the applied power. Gas can be supplied from any suitable gas source such as a cylinder of gas that is connected via a conduit to the chamber and delivered via a mass flow controller or a pressure controller.

After the silicon layer is deposited on the substrate 400, which can be a low expansion glass substrate, a first $Si_3N_4$ interface layer 403a is formed on the silicon layer 402 at 350B as shown in FIG. 6B by sputtering the silicon target 305a using an RF power source and flowing nitrogen gas in the PVD chamber to form the first $Si_3N_4$ interface layer on the silicon layer and a $Si_3N_4$ layer 403 on the silicon target.

As shown in FIG. 6C, at 350C a molybdenum layer 404 is formed on the first $Si_3N_4$ interface layer 403a by sputtering a molybdenum target 305b mounted to a backing plate 373b using a DC power source and flowing an inert gas such as nitrogen in the PVD chamber to form the molybdenum layer 404 on the first $Si_3N_4$ interface layer 403a. As shown in FIG. 6D, the next step in 350D includes sputtering the silicon target 305a including the $Si_3N_4$ layer thereon using a DC power source and flowing an inert gas such as in the PVD chamber to form a second $Si_3N_4$ interface layer 403b on the molybdenum layer 404 until the $Si_3N_4$ layer is depleted from silicon target. After the $Si_3N_4$ layer is depleted from silicon target, a silicon layer is deposited on the second $Si_3N_4$ interface layer. The steps in FIGS. 6B through 6D are then repeated to form a multilayer stack 401 comprising a plurality of reflective layer pairs.

In 6B, while sputtering the silicon target using the RF source and flowing the nitrogen gas in the PVD chamber, the method may further comprise co-flowing an inert gas such as argon in the PVD chamber.

In one or more embodiments, the method comprises repeating the steps in FIGS. 6A through 6D to form the multilayer stack 401 comprising 40 reflective layer pairs. In some embodiments, the multilayer stack exhibits a reflectivity of 13.5 nm light that is greater than a multilayer stack comprising a plurality of reflective layer pairs comprising silicon and molybdenum that does not include the first $Si_3N_4$ interface layer and the second $Si_3N_4$ interface layer.

Operation of the RF power source may comprise operating the RF power source at a frequency in a range of from 5-30 MHz, for example at 13.56 MHz. The RF power source may be operated at a power in a range of 100-800 Watts (W). Gas pressure during operation of the RF power source may be in a range of 0.5 mTorr to 10 mTorr. When argon and nitrogen are co-flowed, the argon/nitrogen gas flow ratio may be in a range of 0.3 to 5. During DC sputtering, the power may be in a range of 300-1500 W, and the argon gas may be at a pressure in a range of 05.-5 mTorr.

The method may further comprise depositing a ruthenium capping layer on the multilayer stack. The method may further comprise depositing an absorber layer on the ruthenium capping layer.

Figure 3:
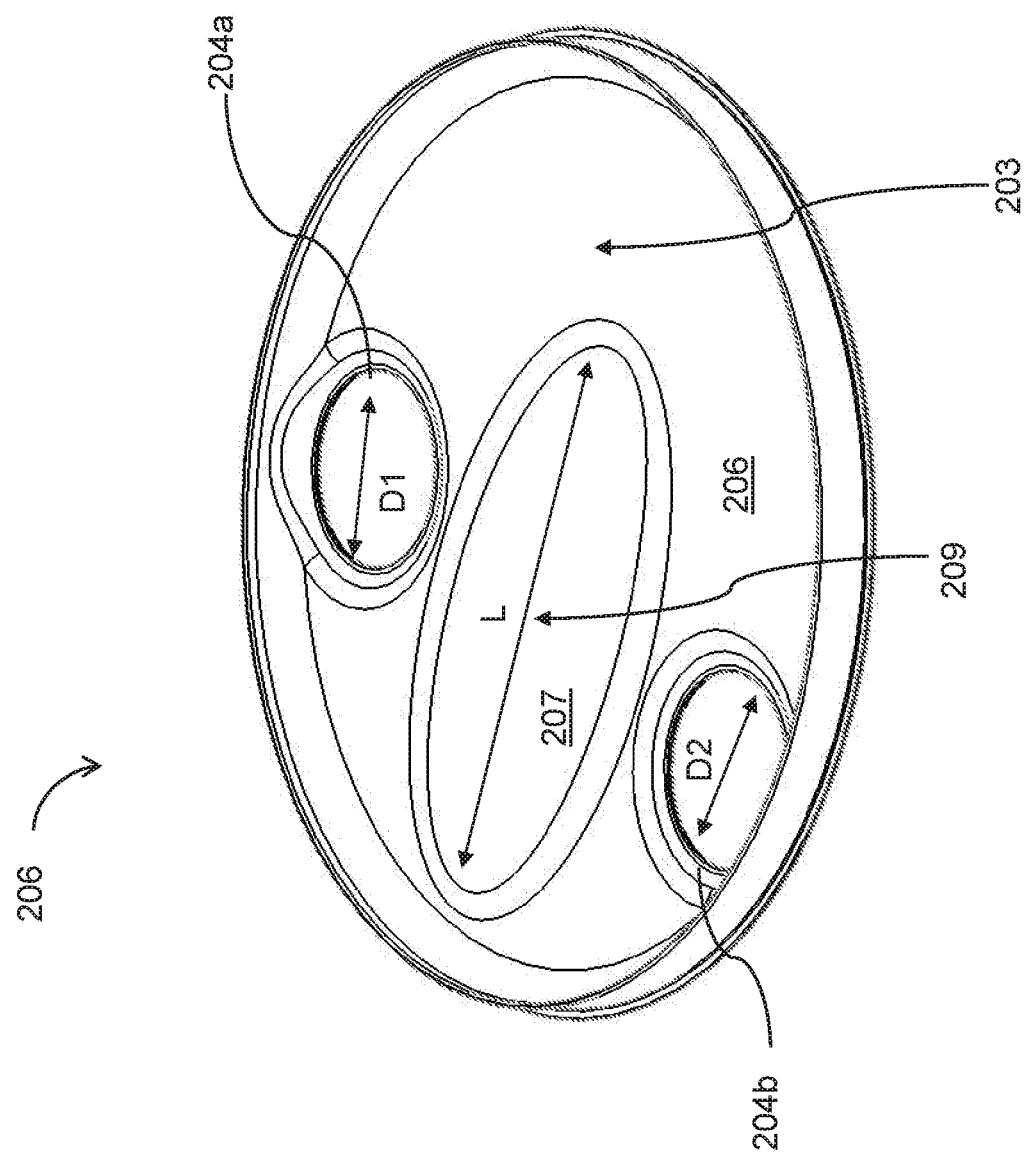
FIG. 3 is a bottom isometric view of the upper shield of the PVD chamber of FIG. 2.

The method to form the multilayer stack may be performed in a PVD chamber as shown in FIG. 2 and a lid as shown in FIG. 3, wherein the PVD chamber comprises a plurality of cathode assemblies including a first cathode assembly including the silicon target, a second cathode assembly including the molybdenum target, and an upper shield below the plurality of cathode assemblies including a first shield hole having a diameter and positioned on the upper shield and with respect to the first and second cathode assemblies to expose the silicon target during and a second shield hole having a diameter and positioned on the upper shield to expose the molybdenum target. In some embodiments of the method, the upper shield has a flat inside surface, except for a region between the first shield hole and the second shield hole and a raised area in the region between the first shield hole and the second shield hole, the raised area having a height sufficient so that during a deposition process, the raised area prevents material sputtered from the silicon target from being deposited on the molybdenum target and to prevent material sputtered from the molybdenum target from being deposited on the silicon target. In some embodiments of the method, the height of the raised area is greater than one centimeter from the flat inside surface and having a length greater than the diameter of the first shield hole and the diameter of the second shield hole.

Another embodiment pertains to a method of manufacturing an EUV mask blank comprising forming a reflective layer pair comprising silicon and molybdenum, wherein forming the reflective layer pair comprises: sputtering a silicon target in a physical vapor deposition (PVD) chamber using a DC power source and an flowing inert gas in the PVD chamber to form a silicon layer on a substrate; sputtering the silicon target using an RF power source and flowing nitrogen gas in the PVD chamber to form a first $Si_3N_4$ interface layer on the silicon layer and a $Si_3N_4$ layer on the silicon target; sputtering a molybdenum target using a DC power source and flowing an inert gas in the PVD chamber to form a molybdenum layer on the $Si_3N_4$ layer; sputtering the silicon target including the $Si_3N_4$ layer thereon using a DC power source and flowing an inert gas in the PVD chamber to form a second $Si_3N_4$ interface layer on the molybdenum layer until the $Si_3N_4$ layer is depleted from silicon target and then depositing a silicon layer on the second $Si_3N_4$ interface layer; repeating steps (350A) through (350D) to form a multilayer stack comprising a plurality of reflective layer pairs comprising 40 reflective layer pairs; forming a capping layer on the multilayer stack; and forming an absorber layer on the capping layer.

Another aspect of the disclosure pertains to an extreme ultraviolet (EUV) mask blank as shown in FIG. 7. The EUV mask blank comprises a substrate 400; a multilayer stack 401 which reflects EUV radiation, the multilayer stack comprising a plurality of reflective layer pair including a silicon layer 402 and a molybdenum layer 404, and an interface layer 403 between the silicon layer and the molybdenum layer, the interface layer comprising $Si_3N_4$; a capping layer 407 on the multilayer stack of reflecting layers; and an absorber layer 409 on the capping layer. In some embodiments, the multilayer stack comprises 40 reflective layer pairs. In some embodiments, the capping layer 407 comprises ruthenium. In some embodiments, the absorber layer comprises tantalum. The multilayer stack exhibits, according to some embodiments, a reflectivity of 13.5 nm light that is greater than a multilayer stack comprising a plurality of reflective layer pairs comprising silicon and molybdenum that does not include the first $Si_3N_4$ interface layer and the second $Si_3N_4$ interface layer. In some embodiments, the thickness of each multilayer of silicon, interface layer and molybdenum is in a range of 5-10 nm, for example 7 nm.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An extreme ultraviolet (EUV) mask blank comprising:
a substrate;
a multilayer stack which reflects EUV radiation, the multilayer stack comprising a plurality of reflective layer pairs including a silicon layer and a molybdenum layer, and an interface layer between the silicon layer and the molybdenum layer, the interface layer comprising $Si_3N_4$;
a capping layer on the multilayer stack of reflecting layers; and
an absorber layer on the capping layer.

2. The EUV mask blank of claim 1, wherein the multilayer stack comprises 40 reflective layer pairs.

3. The EUV mask blank of claim 2, wherein the capping layer comprises ruthenium.

4. The EUV mask blank of claim 3, wherein the absorber layer comprises tantalum.

5. The EUV mask blank of claim 3, wherein the multilayer stack exhibits a reflectivity of 13.5 nm light that is greater than a multilayer stack comprising a plurality of reflective layer pairs comprising silicon and molybdenum that does not include the $Si_3N_4$ interface layer.

6. The EUV mask blank of claim 1, the interface layer comprises a first interface layer on the silicon layer.

7. The EUV mask blank of claim 6, further comprises a second interface layer on the molybdenum layer.

8. The EUV mask blank of claim 6, wherein the second interface layer comprises $Si_3N_4$.

9. The EUV mask blank of claim 8, wherein the multilayer stack comprises 40 reflective layer pairs.

10. The EUV mask blank of claim 9, wherein the multilayer stack comprises a first interface layer on every silicon layer and a second interface layer on every molybdenum layer that has a silicon layer thereon.

11. The EUV mask blank of claim 8, wherein each multilayer of the silicon layer, the interface layer and the molybdenum layer has a thickness in a range of 5-10 nm.

12. The EUV mask blank of claim 8, wherein the thickness of the multilayer of the silicon layer, the interface layer and the molybdenum layer is 7 nm.

13. The EUV mask blank of claim 1, wherein the multilayer stack exhibits a reflectivity of 13.5 nm light is greater than a multilayer stack that does not include the interface layer.

* * * * *